United States Patent [19]

Schmitt et al.

[11] Patent Number: 5,162,730

[45] Date of Patent: Nov. 10, 1992

[54] METHOD FOR OPERATING A MAGNETIC RESONANT IMAGING TOMOGRAPHY APPARATUS

[75] Inventors: Franz Schmitt, Baiersdorf; Hubertus Fischer, Bamberg, both of Fed. Rep. of Germany

[73] Assignee: Siemens Aktiengesellschaft, Munich, Fed. Rep. of Germany

[21] Appl. No.: 611,677

[22] Filed: Nov. 13, 1990

[30] Foreign Application Priority Data

Nov. 20, 1989 [EP] European Pat. Off. ........ 89121460.3

[51] Int. Cl.⁵ .............................................. G01V 3/00
[52] U.S. Cl. .................................... 324/309; 324/307
[58] Field of Search ............... 324/300, 307, 309, 311, 324/312; 128/653.1, 653.2

[56] References Cited

U.S. PATENT DOCUMENTS

| | | | |
|---|---|---|---|
| 4,733,188 | 3/1988 | Sekihara et al. | 324/309 |
| 4,740,748 | 4/1988 | Rzedzian | 324/309 |
| 4,767,991 | 8/1988 | Rzedzian | 128/653.2 |
| 4,794,337 | 12/1988 | Twieg | 324/309 |
| 4,868,502 | 9/1989 | Hanakawa et al. | 324/309 |

FOREIGN PATENT DOCUMENTS

| | | |
|---|---|---|
| 0076054 | 4/1983 | European Pat. Off. . |
| 0256779 | 2/1988 | European Pat. Off. . |
| 0291282 | 11/1988 | European Pat. Off. . |
| 0310434 | 4/1989 | European Pat. Off. . |
| 2056078 | 3/1981 | United Kingdom . |

OTHER PUBLICATIONS

"Recent Advances in Magnetic Resonance Imaging", Riederer, Proceedings of the IEEE, vol. 76, No. 9, Sep. 1988 (pp. 1095-1105).

*Primary Examiner*—Louis Arana
*Attorney, Agent, or Firm*—Hill, Van Santen, Steadman & Simpson

[57] ABSTRACT

A method, in the form of a pulse sequence for operating a magnetic resonance imaging tomography apparatus according to a modification of the echo planar method includes the generation of a read-out gradient consisting of sub-pulses having reversing polarity, the read-out gradient being activated in each scan after an RF excitation. A phase coding gradient, also consisting of a number of sub-pulses, is activated at each polarity change of the read-out gradient. The sub-pulses of the phase coding gradient have a polarity which alternates from sub-pulse to sub-pulse, and an amplitude-time area which increases in steps. An improved signal-to-noise ratio is achieved with this pulse sequence and N/2 ghosts are avoided.

5 Claims, 5 Drawing Sheets

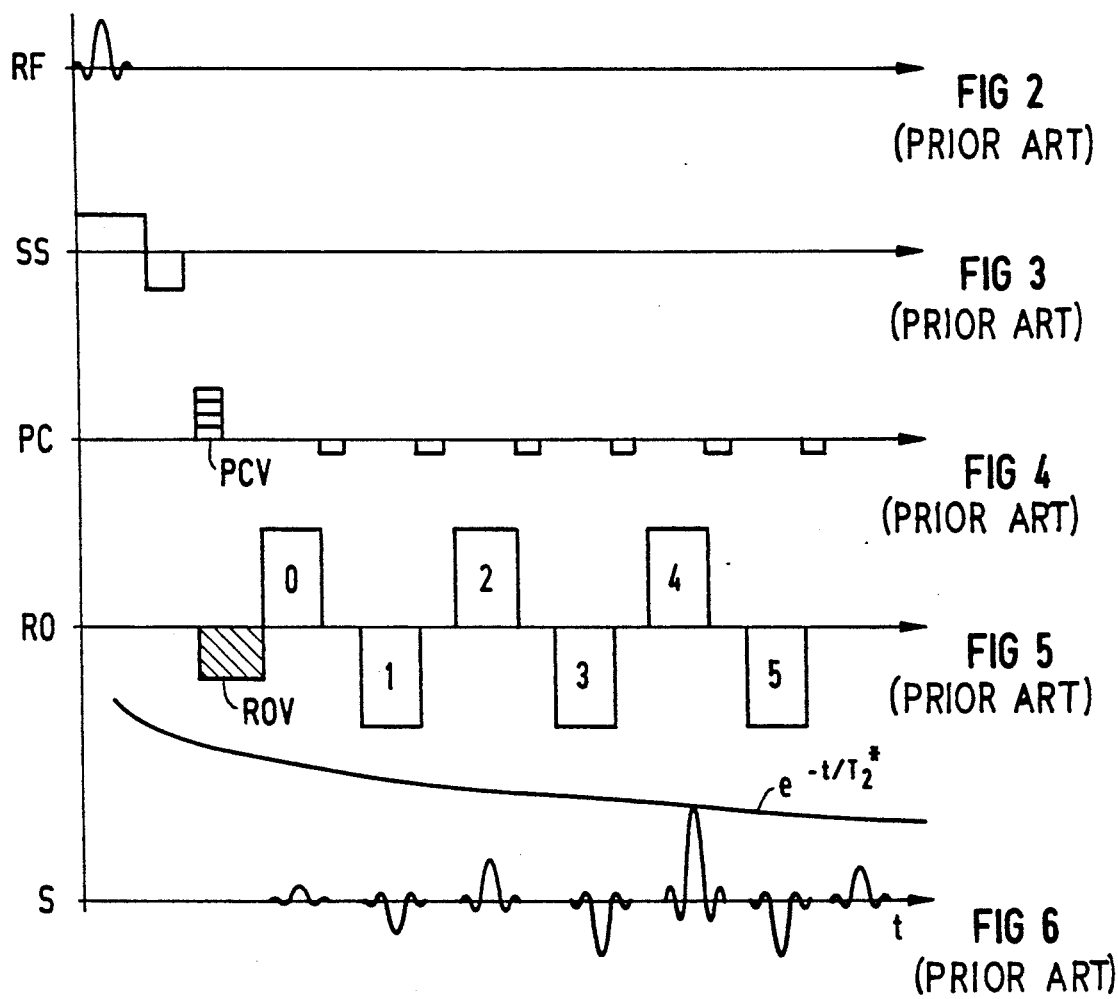
FIG 2 (PRIOR ART)
FIG 3 (PRIOR ART)
FIG 4 (PRIOR ART)
FIG 5 (PRIOR ART)
FIG 6 (PRIOR ART)
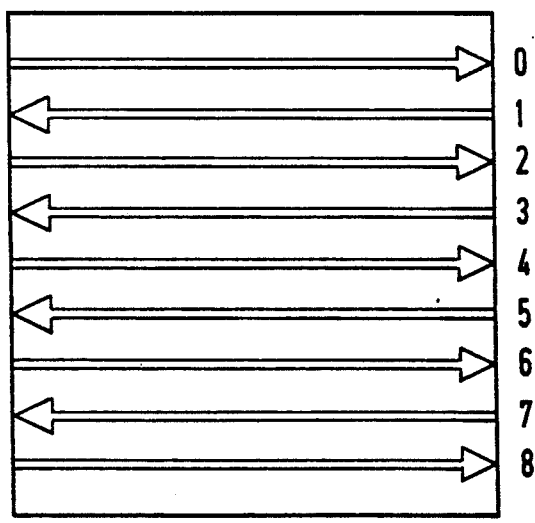
FIG 7 (PRIOR ART)

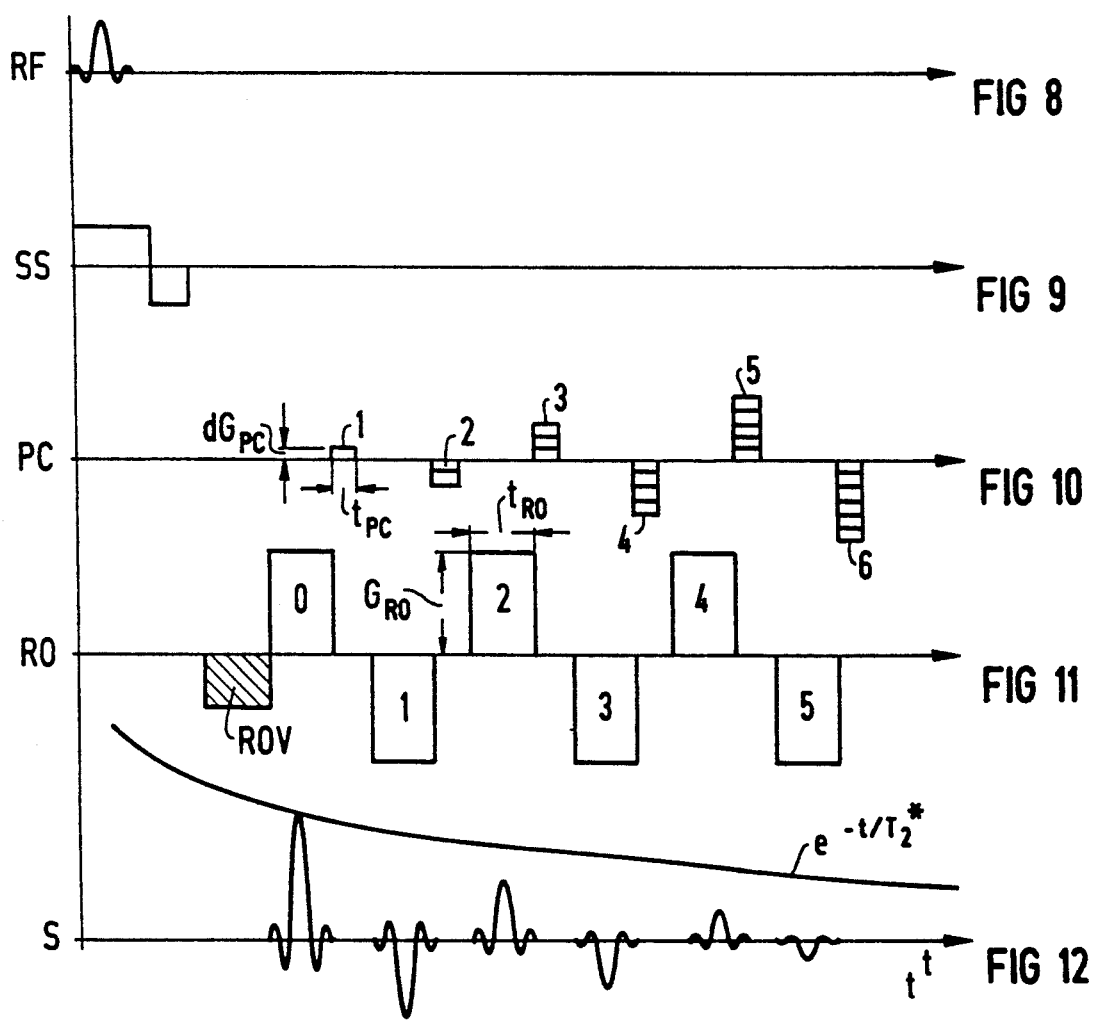
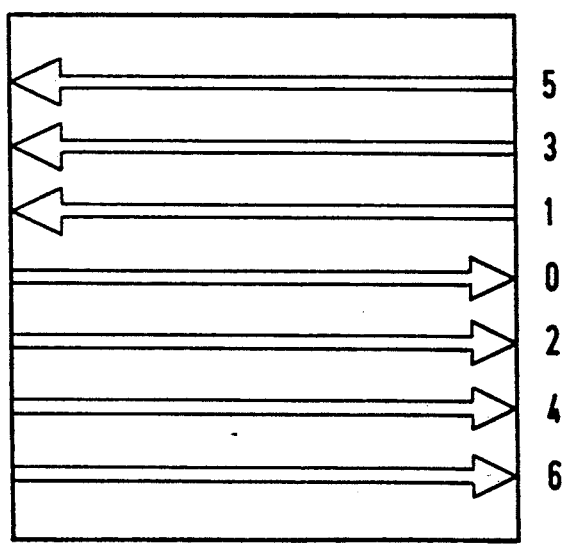

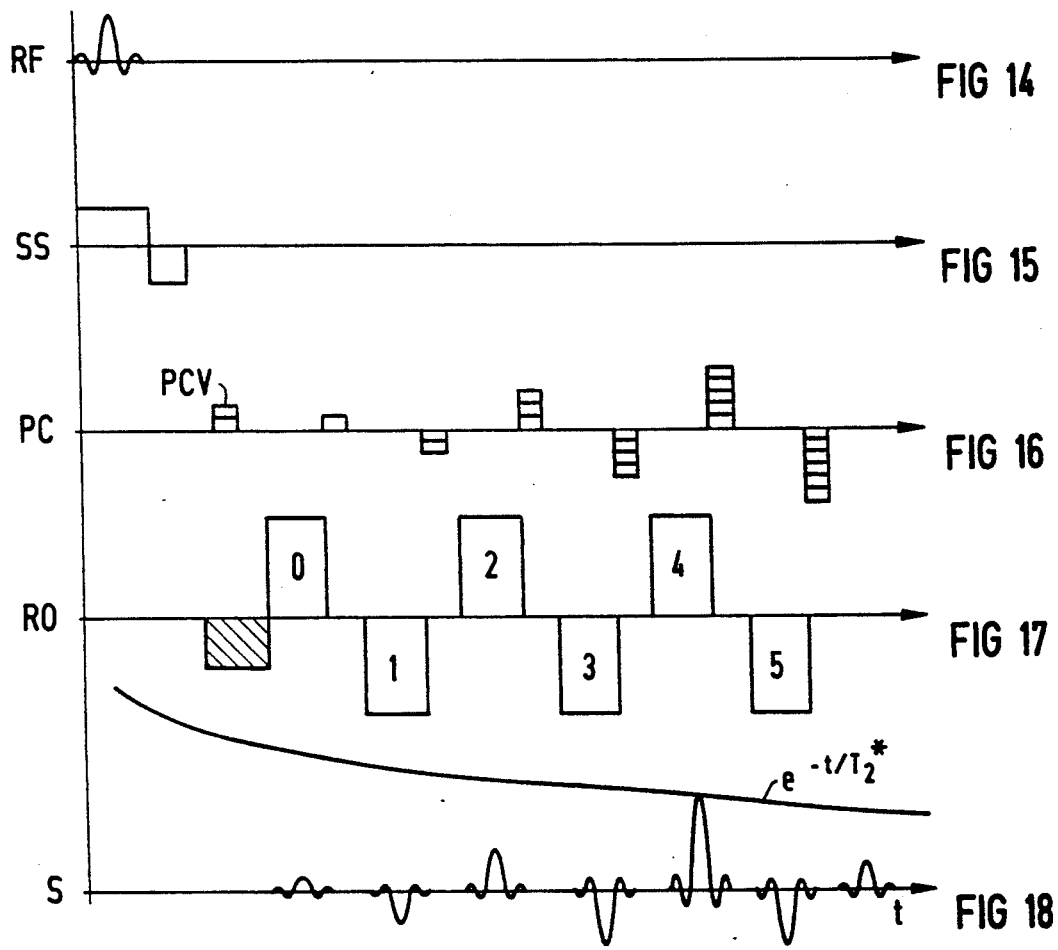
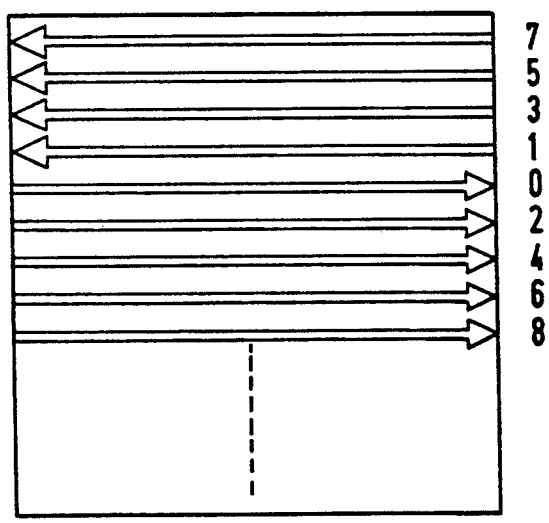

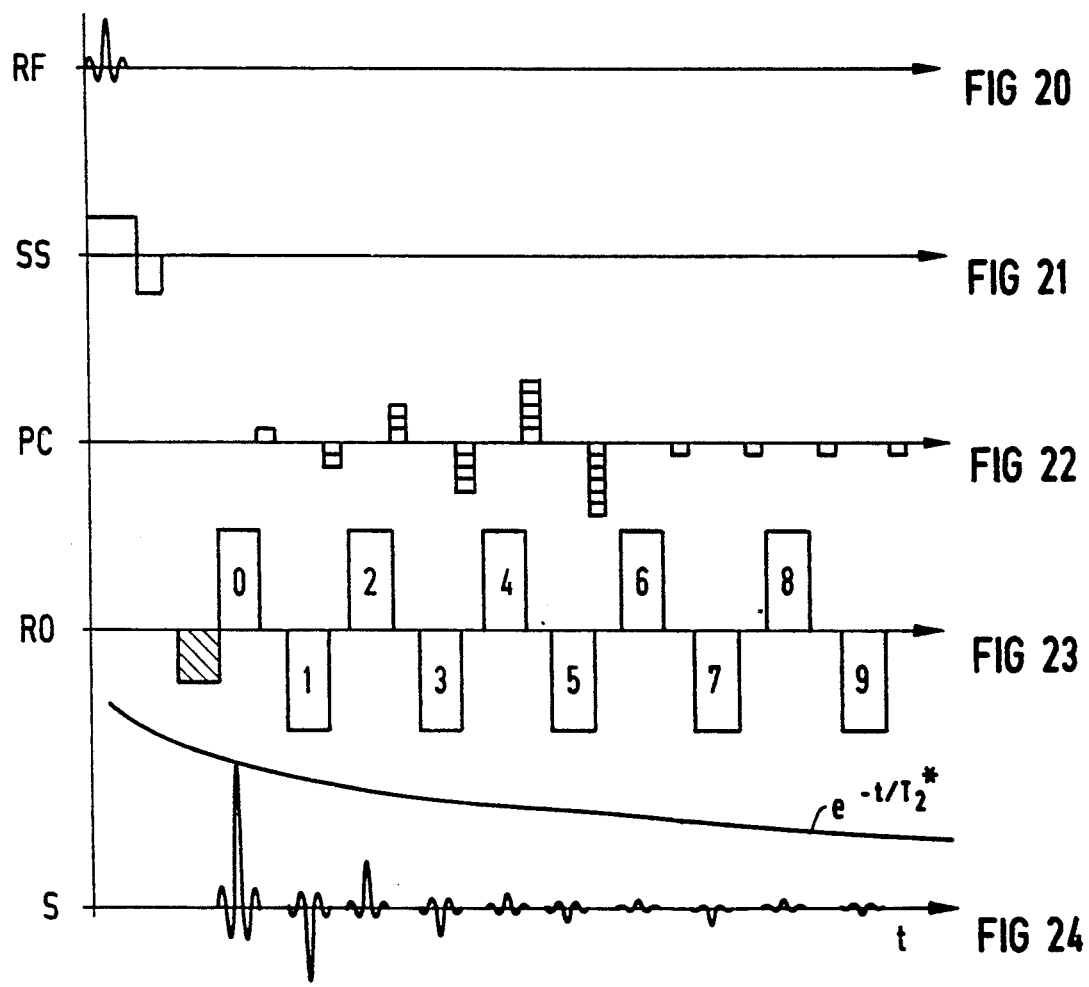
FIG 20
FIG 21
FIG 22
FIG 23
FIG 24
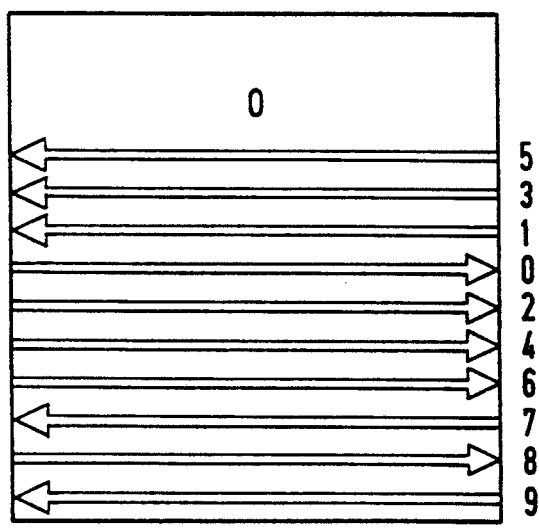
FIG 25

METHOD FOR OPERATING A MAGNETIC RESONANT IMAGING TOMOGRAPHY APPARATUS

BACKGROUND OF THE INVENTION

1. Field of the Invention

The present invention is directed to a method, in the form of a pulse sequence, for operating a magnetic resonance imaging tomography apparatus, and in particular to such a pulse sequence which is based on the known echo planar method.

2. Description of the Prior Art

A pulse sequence for operating a magnetic resonance imaging (MRI, or Nuclear Magnetic Resonance, NMR) tomography apparatus is known in the art, referred to as the echo planar method. In this known method, a read-out gradient consisting of a plurality of sub-pulses of alternating polarity and at least one phase coding gradient are activated for each scan after an RF excitation. The phase coding gradient consists of sub-pulses which are activated at each polarity change of the read-out gradient, and the resulting signals are digitized and written into a row of a raw data matrix in the K-space per subpulse of the read-out gradient. The rows of the matrix are ordered according to the phase factors defined by the phase coding gradients. Such a pulse sequence is disclosed in European application 0 076 054, corresponding to U.S. Pat. No. 4,509,015.

FIG. 1 shows a typical, conventional magnetic resonance imaging tomography apparatus and FIGS. 2–7 describe the aforementioned known echo planar method, for the purpose of explaining problems associated with this known method.

The apparatus shown in FIG. 1 includes fundamental field coils 1, 2, 3 and 4 which generate a static magnetic field in which the body of a patient 5 to be examined is disposed, if the device is used for medical diagnostics. Gradient coils are also provided which generate independent, orthogonal magnetic fields in the x, y, and z directions, according to the coordinate axes 6. For clarity, only gradient coils 7 and 8 are shown in FIG. 1, which, in combination with a pair of identical gradient coils disposed opposite thereto (not shown) generate the x-gradient. A set of y-gradient coils (not shown) are disposed parallel to the body 5, above and below the body 5, and a set of z-gradient coils (not shown) are disposed at the head and feet of the patient 5, extending transversely relative to the longitudinal axis of the patient 5.

The apparatus also includes an RF antenna 9, which generates and picks-up the nuclear magnetic resonance signals. The coils 1, 2, 3, 4, 7, 8, and 9 surrounded by the dot-dash line 10 constitute the actual examination instrument. The examination instrument is operated by electrical components which include a power supply 11 for the fundamental field coils 1 through 4, and a gradient fields power supply 12, for supplying power to the gradient coils 7 and 8 as well as the further gradient coils. The RF coil 9 is coupled via a signal amplifier 14, or via a RF transmitter 15, to a process control computer 17. A display 18 is connected to the computer 17 for portraying a visual image of the slice of interest. The components 14 and 15 form a RF unit 16 for signal generation and pick-up. A switch 19 permits switching between the transmission mode and the reception mode.

The principle of image generation according to the known echo planar imaging (EPI) method shall be set forth in greater detail with reference to FIGS. 2 through 7. A more detailed disclosure thereof may be found in the aforementioned European application 0 076 054, and U.S. Pat. No. 4,509,015.

At the beginning of a pulse sequence, an RF excitation pulse RF as shown in FIG. 2 is generated under the influence of a slice selection gradient SS. Nuclear spins in a slice of the examination subject are thus excited. Subsequently, the direction of the gradient SS is inverted, and the negative part of the gradient SS cancels the dephasing of the nuclear spins caused by the positive part of the gradient SS.

After the excitation, a phase coding gradient PC as shown in FIG. 4 is generated in the y-direction, and a read-out gradient RO as shown in FIG. 5 is generated in the x-direction. The read-out gradient RO consists of a preliminary pulse ROV and sub-pulses referenced 0 through 5, having alternating polarity. The sub-pulses of the read-out gradient RO are considered as being square-wave pulses in simplified terms, however, in practice a sine function is usually employed, because this is simpler to achieve in terms of the bandwidths of the components used to generate the pulse.

Due to the changing polarity of the read-out gradient RO, the nuclear spins are alternatingly dephased and rephased, so that a sequence of signals S, shown in FIG. 6, arises. After a single excitation, sufficient signals are thus acquired that the entire Fourier K-space is scanned, i.e., the data obtained in this manner are adequate for the reconstruction of a complete tomogram.

The phase coding gradient PC is briefly activated at each change in the polarity of the read-out gradient RO. The phase relation of the nuclear spins is thus forwarded by one step with each activation. A preliminary phasing gradient PCV is activated before the read-out sequence, the purpose thereof being described below.

The resulting nuclear magnetic resonance signals S are sampled in the time domain, are digitized, and the numerical values acquired in this manner are entered into a raw data matrix. The raw data matrix can be considered to be a measured data space, and since in the exemplary embodiment it is two-dimensional, it constitutes a measured data plane. This measured data space or plane is generally referred to as "K-space" in magnetic resonance imaging tomography.

The information regarding the spatial origin of the signal contributions S, needed for the imaging, is coded in the phase factors, with the relationship between the locus space (i.e., the image) and the K-space being mathematically representable as two-dimensional Fourier transformation. This can be expressed as the following equation:

$$S(k_x,k_y)= \int \int \zeta(x,y) \exp(i(k_x x + k_y y))dxdy.$$

The following definitions apply:

$$k_x(t) = \gamma \int_o^t G_x(t')dt';$$

$$k_y(t) = \gamma \int_o^t G_y(t')dt';$$

wherein $\gamma$ is the gyromagnetic ratio, $G_x(t')$ is the momentary value of the read-out gradient RO, and $G_y(t')$ is the momentary value of the phase coding gradient PC.

In the raw data matrix shown in FIG. 7, the row numbers correspond to the numbers of sub-pulses of the read-out gradient shown in FIG. 5. For clarity, only eight rows are shown in FIG. 7; in practice, this number is significantly greater, for example 256.

Due to the step-by-step forwarding of the phase coding gradient PC, the sampling in the K-space ensues in successive rows, beginning with the row 0. The change in polarity of the read-out gradient is taken into consideration in that the measured values are entered in the opposite direction in successive rows, for example, toward the right beginning at the left in row 0, and toward the left beginning at the right in row 1.

An image matrix, on the basis of which an image reconstruction can then ensue, is acquired from the raw data matrix shown in FIG. 7 by two-dimensional Fourier transformation. The Fourier transformation supplies the best results if the measured values allocated to the signal maximum reside on the middle row (i.e., in row 4 in the exemplary embodiment). Image artifacts may otherwise arise. Placing the maximum in the "correct" row is achieved by a pre-phasing of the nuclear spins in the y-direction by the pulse PCV of FIG. 4. This pulse is set so that a rephasing is achieved exactly for the middle row (i.e., row 4 in the exemplary embodiment).

The sequence of the measured Fourier rows in the K-space is thus prescribed in the conventional EPI method. Moreover, the measured Fourier rows must be alternatingly entered into the measurement matrix in positive and negative directions, because the read-out gradient alternates in those directions.

This known technique of data acquisition, however, has two significant disadvantages. First, this known method is susceptible to what are known as "N/2 ghosts" due to the alternating entry into the measurement matrix. These arise even if slight deviations exist from row-to-row. This results, given an image matrix of N×N points, in the actual image being again imaged shifted by N/2 points in the positive and negative directions, with respect to the middle of the image matrix, generally the ghost images being of a different intensity than the actual image.

A second disadvantage is that the middle measurement rows in the K-space are only read out in the middle of the read-out sequence, given a symmetrically obtained measurement matrix. These middle rows significantly define the signal-to-noise ratio of the image. The FID envelope which would derive given a free induction decay, and which represents the maximally obtainable amplitude of the individual echoes according to FIG. 6, decays according to the function $\exp(-t/T_2^*)$ after the excitation, this function being shown in FIG. 6. The value $T_2^*$ is the time constant for the loss of the phase cohesion of the spins, taking magnetic field inhomogeneities into consideration. At that time at which the middle Fourier rows are read out, the signal amplitude is thus already noticeably diminished in comparison to the beginning of the read-out interval. The signal-to-noise ratio is therefore degraded.

SUMMARY OF THE INVENTION

It is an object of the present invention to provide a pulse sequence for operating a magnetic resonance imaging tomography apparatus based on the echo planar imaging method wherein N/2 ghosts are eliminated and such that the middle Fourier rows are read out optimally early after the RF excitation.

This object is achieved in accordance with the principles of the present invention in a method wherein the sub-pulses of the phase coding gradient have a polarity which alternates from sub-pulse to sub-pulse, and have an amplitude-time area which increases in steps. Because no pre-phasing is needed, the middle Fourier row is formed from the measured values of the first echo signal, i.e., immediately after the RF excitation pulse, at which time the FID signal has only slightly decayed. Due to the changing polarity of the phase coding gradient, all rows above the middle row are read out in a uniform, first direction and all rows below the middle row are read out in a uniform, second direction, opposite to the first direction. The cause of N/2 ghosts is thus eliminated.

The amplitude-time area of the sub-pulses of the phase coding gradient preferably increases in constant steps. The phase factors are thus also varied by constant amounts, resulting in a constant row spacing in the K-space.

In a preferred embodiment, a pre-phasing pulse in the direction of the phase coding gradient is activated before the first sub-pulse of the read-out gradient. Although the middle Fourier row is no longer read out in the first echo signal after the excitation, the disturbing transition from the rows of a first read-out direction to the rows of an opposite read-out direction is displaced out of the middle of the matrix, and thus has less of an influence on the image. The pre-phasing gradient can be made significantly smaller than in conventional methods, so that the read-out of the middle Fourier row ensues a shorter chronological distance from the excitation than in such conventional methods, and thus the signal-to-noise ratio is less degraded.

In a further embodiment, the sub-pulses of the phase coding gradient are activated first with changing polarity and increasing amplitude-time area only in a first part of each pulse sequence for signal acquisition for the central rows of the raw data matrix, and the sub-pulses are thereafter activated with constant polarity and amplitude-time area. The maximum gradient amplitude required is thus reduced.

DESCRIPTION OF THE DRAWINGS

FIGS. 2-7 are pulse diagrams and a raw data matrix according to the known echo planar imaging method.

FIGS. 8-13 are pulse diagrams and a raw data matrix according to a first embodiment of a method in accordance with the principles of the present invention.

FIGS. 14-19 are pulse diagrams and a raw data matrix according to a second embodiment of method according to the principles of the present invention.

FIGS. 20-25 are pulse diagrams and a raw data matrix according to a third embodiment of the method in accordance with the principles of the present invention.

DESCRIPTION OF THE PREFERRED EMBODIMENTS

Figure 1:
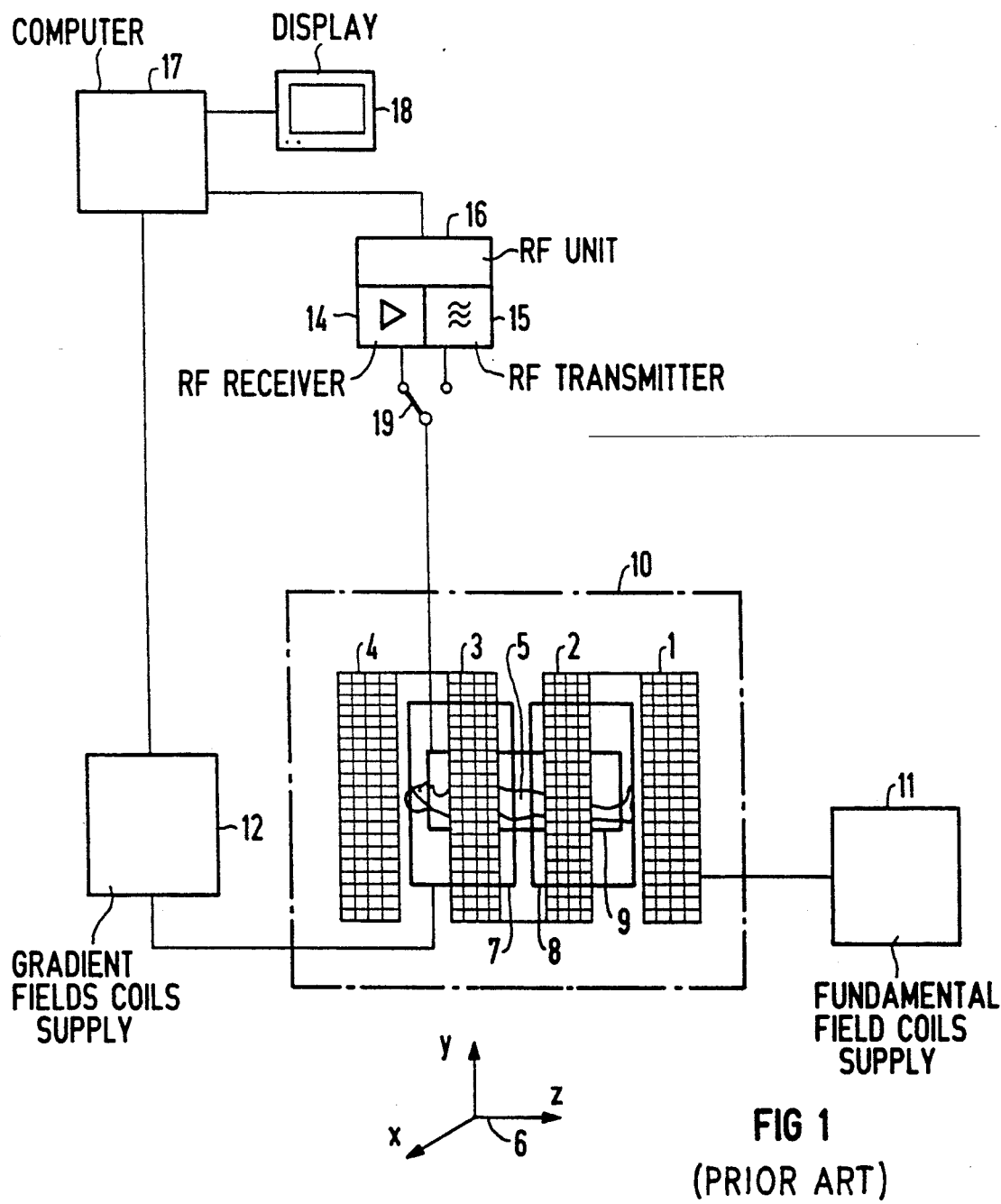
FIG. 1 is a schematic block diagram of a conventional magnetic resonance imaging tomography apparatus of the type which can be operated according to known methods, as well as according to the inventive method disclosed herein.

In the first exemplary embodiment of the method shown in FIGS. 8 through 13, an RF pulse RF of FIG. 8 is first generated, which is made slice-selective by the simultaneous activation of a slice selection gradient SS shown in FIG. 9. By inverting the slice selection gradient SS in a second part thereof, dephasing of the nuclear spins produced in the first part of the gradient SS is canceled. A read-out gradient RO is subsequently activated in the negative direction (ROV). As in the conventional echo planar imaging method, sub-pulses of the read-out gradient RO are subsequently activated with changing polarity. Only five sub-pulses are shown in FIG. 11. A phase coding gradient PC is activated between each two sub-pulses of the read-out gradient RO. The phase coding gradients also have changing polarity. All of the phase coding gradients have a constant duration $t_{pc}$. The first phase coding gradient 1 has an amplitude $dG_{PC}$, and the following phase coding gradients (referenced 2 through 6 in FIG. 10) have amplitudes respectively increasing by the step $dG_{PC}$.

As also in the conventional echo planar imaging method, the signals shown in FIG. 12 are sampled under each sub-pulse of the read-out gradient RO, and the sampled values are written into a row a measurement matrix, shown in FIG. 13. Because positive and negative phase coding gradients PC are used, the signal allocated to the first sub-pulse zero of the read-out gradient RO is now allocated to the middle Fourier row. In FIG. 13, the allocations between the sub-pulses 0 through 5 of the read-out gradient and the rows of the raw data matrix (also referred to as "Fourier rows") are identified with the same reference numbers.

Due to the changing polarity of the phase coding gradient PC, the Fourier rows are alternatingly entered into the upper half and into the lower half of the raw data matrix. The measured values for the upper half of the raw data matrix are thus entered in a uniform, first direction, and the measured values are entered in the lower half of the raw data matrix in a uniform, second direction, opposite to the first direction. In the exemplary embodiment, for example, the measured values in the upper half of the raw data matrix are entered in the negative direction, and those in the lower half are entered in the positive direction. The initially described disadvantages of the EPI method are thus eliminated with the illustrated pulse sequence. The measured values at the beginning of the read-out sequence, at which time the FID signal has only slightly decayed, are entered into the middle of the raw data matrix. Because the middle of the raw data matrix primarily defines the signal-to-noise ratio, the signal-to-noise ratio is thereby improved. The pre-phasing gradient, which is necessary in the conventional EPI method to bring the maximum of the measured signal into the middle row of the raw data matrix, is eliminated.

The alternating classification of data entries in the raw data matrix, which leads to N/2 ghosts, is eliminated in the method of FIGS. 8-13 due to the uniform direction of the entry of the measured values in the respective upper and lower regions of the raw data matrix.

The transition in the middle row remains the sole discontinuity, i.e., the row 0 of FIG. 13, with the entry of the measured values in the positive direction to row 1 with the entry of the signals in the negative direction. Because these rows (i.e., rows 0 and 1) contain signals which make significant contributions to the overall image, image artifacts in the form of smears in the phase coding direction may arise.

To minimize the formation of such image artifacts, a pre-phasing with a pre-phasing pulse PCV in the phase coding direction of FIG. 16 may be undertaken as shown in the exemplary embodiment of FIGS. 14 through 19. Otherwise, the pulse sequence shown in FIGS. 14 through 18 coincides with the pulse sequence of FIGS. 8 through 12. For example, the pre-phasing pulse PCV may have the amplitude $2dG_{PC}$. The echo signal to be entered in the middle row of the raw data matrix thus arises with the highest amplitude under the sub-pulse 4 of the read-out gradient. Although this signal is somewhat attenuated in comparison to that appearing under the first sub-pulse 0, it is nonetheless far less attenuated than in the conventional EPI method. As a trade-off, the advantages achieved that the transition from positive to negative read-out directions of the signals in the raw data matrix, and thus the discontinuity, is shifted to the rows of the raw data matrix which contribute less to the image signal, and are somewhat farther from the middle row so that the possible artifacts are therefore diminished.

In the exemplary embodiments described heretofore, phase-coding gradient pulses having extremely high amplitude and extremely short duration are necessary. Given a rectangular image shape, the maximally required gradient amplitude $G_{PC}^{max}$ is defined by:

$$G_{PC}^{max} = \frac{t_{RO}\, G_{RO}}{2 t_{PC}},$$

wherein $t_{RO}$ is the chronological duration of a sub-pulse of the read-out gradient RO, $t_{PC}$ is the chronological duration of a sub-pulse of the phase coding gradient, and $G_{RO}$ is the amplitude of the read-out gradient.

The shorter phase coding gradient pulse would thus have to be higher by the factor $\frac{1}{2} (t_{RO}/t_{PC})$ than the longer sub-pulse of the read-out gradient. This can be technologically achieved only with significant component outlay.

An exemplary embodiment is shown in FIGS. 20-25 wherein the demands made on the gradient power supply are lower. This exemplary embodiment differs from that shown in FIGS. 8 through 12 only in that the first six phase coding gradient pulses have alternating operational sign and amplitude increasing in steps. Subsequent pulse generation is undertaken in a known manner with phase coding gradient pulses of constant amplitude and uniform polarity. As shown in FIG. 25, only the middle rows of the raw data matrix are thus occupied with a uniform read-out direction, whereas the rows of the raw data matrix which are farther toward the bottom are occupied with alternating read-out directions in a conventional way. The rows of the raw data matrix at the top are filled with zeroes. The lack of data in the upper rows can be ignored without a significant loss in the image quality by undertaking a half-Fourier image reconstruction.

Given this embodiment, forwarding of the amplitude of the phase coding gradient pulses will be continued as long as the gradient coil and the gradient amplifier permit, and subsequent pulse generation will be undertaken in a conventional way with phase coding gradient pulses of constant amplitude.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance imaging apparatus for obtaining a tomogram of an examination subject, comprising the steps of:
   subjecting said examination subject to an RF excitation pulse to excite nuclear spins in said examination subject and thereby to produce nuclear magnetic resonance signals;
   reading out said nuclear magnetic resonance signals under a read-out gradient consisting of a plurality of pulses of alternating polarity;
   phase coding the read out nuclear magnetic resonance signals by generating a phase coding gradient after said RF excitation pulse, said phase coding gradient consisting of a plurality of pulses, respectively occurring at each change in polarity of said read-out gradient, and alternating in polarity from pulse to pulse and having an amplitude-time area increasing in steps from pulse to pulse;
   digitizing the read-out nuclear magnetic resonance signals;
   entering the digitized read-out nuclear magnetic resonance signals from each pulse of said read-out gradient into respective rows of a raw data matrix in K-space controlled by the phase factors of said phase coding gradient; and
   constructing a tomogram from said raw data matrix.

2. A method as claimed in claim 1 wherein the step of phase coding the readout nuclear magnetic resonance signals is further defined by generating a phase coding gradient having an amplitude-time area increasing in constant steps from pulse to pulse.

3. A method as claimed in claim 1 wherein the step of phase coding the readout nuclear magnetic resonance signals is further defined by generating a phase coding gradient consisting of pulses having identical chronological duration.

4. A method as claimed in claim 1 comprising the additional step of:
   generating a pre-phasing pulse in the direction of said phase coding gradient before a first pulse of said read-out gradient.

5. A method as claimed in claim 1 wherein said raw data matrix has central rows, and wherein the step of phase coding the read out nuclear magnetic resonance signals is further defined by generating said phase coding gradient having pulses alternating in polarity from pulse to pulse and pulses having an amplitude-time area increasing in steps from pulse to pulse only during read-out of said nuclear magnetic resonance signals for said central rows of said raw data matrix, and thereafter generating a phase coding gradient consisting of a plurality of pulses of constant polarity and constant amplitude-time area.

* * * * *